United States Patent [19]

Birkett et al.

[11] Patent Number: 5,051,709
[45] Date of Patent: Sep. 24, 1991

[54] SAW DEVICE TAPPED DELAY LINE AND EQUALIZER

[75] Inventors: Alexander N. Birkett, Ottawa, Canada; Paul A. Kennard, Fremont, Calif.; Thomas P. Cameron, Kanata, Canada; Barry A. Syrett, Ottawa, Canada; Stephen G. Barber, Nepean, Canada; Mark S. Suthers, Lanark, Canada

[73] Assignee: Northern Telecom Limited, Montreal, Canada

[21] Appl. No.: 382,921

[22] Filed: Jul. 20, 1989

[51] Int. Cl.[5] .......................... H04B 3/14; H03H 9/42
[52] U.S. Cl. .................................. 333/28 R; 333/152; 333/154; 333/166
[58] Field of Search .............................. 333/150–154, 333/193–196, 166, 28 R; 310/313 R, 313 B, 313 C, 313 D

[56] References Cited

U.S. PATENT DOCUMENTS

| 3,648,081 | 3/1972 | Lean et al. | 333/150 X |
|---|---|---|---|
| 3,727,153 | 4/1973 | McAullife | 333/166 X |
| 4,434,481 | 2/1984 | Toda et al. | 310/313 R X |
| 4,814,658 | 3/1989 | Suthers | 310/313 D |

FOREIGN PATENT DOCUMENTS

| 28840 | 3/1977 | Japan | 333/150 |
|---|---|---|---|
| 1015488 | 4/1983 | U.S.S.R. | 333/195 |

OTHER PUBLICATIONS

Manes et al., "A Microprocessor Controlled Transversal Filter Based on a SAW Delay Line"; *Alta Frequenza* (Italy); vol. 51, No. 3; May/Jun. 1982; pp. 134–142.
Article by Carl M. Panasik et al., "A 32 Tap Digitally Controlled Programmable Transversal Filter", IEEE, 1988 Ultrasonics Symposium.

*Primary Examiner*—Eugene R. LaRoche
*Assistant Examiner*—Benny Lee
*Attorney, Agent, or Firm*—R. John Haley; Dallas F. Smith

[57] ABSTRACT

A SAW device tapped delay line includes an apodized input IDT (inter-digital transducer) and a plurality of substantially identical unapodized output IDTs arranged to receive, after delays which successively increase by an amont T, a SAW propagated from the input IDT. Each output IDT is terminated with a low impedance which is constituted by the low input impedance of a buffer amplifier, to minimize acoustic regeneration by the output IDTs. Grounded dummy fingers with the same metallization ratio as the output IDTs are provided between adjacent output IDTs to provide a constant SAW velocity. The delay line is particularly suited to use in an equalizer of a microwave radio transmission system, in which the delay T is the inverse of the symbol rate of the system. Intermediate frequency automatic time domain equalizer (IF ATDE) arrangements using the SAW device tapped delay line are described.

10 Claims, 6 Drawing Sheets

SAW DEVICE TAPPED DELAY LINE AND EQUALIZER

This invention relates to a SAW (surface acoustic wave) device tapped delay line, and to apparatus, especially an equalizer for a receiver of a microwave radio digital signal transmission system, incorporating such a delay line.

BACKGROUND OF THE INVENTION

It is well known to use SAW devices for filtering purposes in microwave radio transmission systems. With increasing capacities of such systems, very stringent demands have been placed on the design and fabrication of such SAW devices, so that they have been developed to an advanced stage. For example, Suthers et al. U.S. Pat. No. 4,814,658 issued Mar. 21, 1989 and entitled "SAW DEVICE WITH CONTINUOUS FINGER PATTERN" describes and claims an advanced form of SAW device which is particularly useful for filtering purposes in microwave radio systems, and discusses earlier developments embodied in such a SAW device.

In addition to filters, microwave radio systems include other circuits, such as equalizers, which can benefit by the incorporation therein of appropriate SAW devices. In particular, a microwave radio receiver invariably includes an ATDE (automatic time domain equalizer), which may incorporate a transversal filter comprising a tapped delay line.

In conventional receivers of microwave radio systems which use QAM (quadrature amplitude modulation, in which signals are modulated onto two carrier signal components, referred to by the letters I and Q, in phase quadrature), the ATDE has typically been provided at baseband, relatively separately for the I and Q components. This has necessitated duplication of many parts of the ATDE for the I and Q components. This is a particular disadvantage for ATDEs with delay lines with a large number of taps, for which there is an increasing requirement with increasing capacity of the radio system.

In order to avoid this disadvantage, it is possible to implement the ATDE in the IF (intermediate frequency, typically 70 MHz) stages of the radio receiver. In such an IF ATDE, the tapped delay line has to date had to be constituted by a series of lumped delay elements, which are bulky and expensive and have to be tuned by skilled persons. These factors become increasingly disadvantageous as the number of taps of the delay line increases.

It is desirable, therefore, to replace the series of lumped delay elements by a tapped delay line constituted by a SAW device, which is suited to operation at the intermediate frequency. However, the nature and properties of SAW devices, some of which are discussed further below, make it very difficult to provide a SAW device which can meet the stringent demands imposed by a high capacity microwave radio system.

In an article by Carl M Panasik et al. entitled "A 32 TAP DIGITALLY CONTROLLED PROGRAMMABLE TRANSVERSAL FILTER", 1988 Ultrasonics Symposium, pages 151 to 154, there is described a digitally controlled programmable transversal filter (DCPTF) which uses a SAW device providing a delay line with 32 taps. This DCPTF is intended for use as a bandpass filter with a programmable center frequency and bandwidth. A radio frequency signal is supplied to an input IDT (inter-digital transducer) of the SAW device, and the resulting SAW propagated towards 32 sequentially spaced output IDTs results in variously delayed "copies" of the input signal at the output taps. These are weighted by respective tap weight control amplifiers, each constituted by a segmented dual-gate FET pair with binarily scaled gains, duplicated for positive and negative polarities, whose outputs are summed to produce a programmably filtered signal.

Although this article discloses a SAW device tapped delay line, such a device is unsuitable for use in a microwave radio receiver IF ATDE as discussed above in view of the stringent demands thereof. There are a number of reasons for this, arising from the nature and properties of SAW devices. Apart from considerations of reflections which are considered in the Suthers et al. patent referred to above, particular factors of importance in relation to a SAW device tapped delay line relate to acoustic regeneration at the output IDTs and reflections among these IDTs.

Acoustic regeneration at each IDT occurs in that an incident SAW generates a voltage across the IDT, which in turn regenerates SAWs which propagate from the IDT in both directions, these regenerated SAWs being incident on adjacent IDTs. Reflections among IDTs arise in that mass and electrical loading (MEL) imposed by the IDT fingers on the substrate of the SAW device produce impedance discontinuities, and hence SAW reflections, at the finger edges. Within the individual IDTs these reflections can be made self-cancelling by the use of split finger pairs as is known in the prior art, but this is not possible in an IF ATDE SAW device for reflections between the output IDTs. This is because the finger spacing or pitch is determined by the center frequency (i.e. the IF) at which the SAW device is designed to operate, whereas the spacing or pitch of the output IDTs must be equal to the inverse of the symbol rate of the microwave radio system, which is generally unrelated to this center frequency.

An object of this invention, therefore, is to provide an improved SAW device tapped delay line which is particularly suitable for use in an IF ATDE of a microwave radio receiver.

SUMMARY OF THE INVENTION

According to this invention there is provided a SAW (surface acoustic wave) device tapped delay line comprising: a first IDT (inter-digital transducer) for generating a SAW in response to an input signal applied thereto; a plurality of second IDTs substantially identical to each other, arranged adjacent one another so as to have a predetermined pitch, with one of the second IDTs adjacent the first IDT for sequential propagation of the SAW from the first IDT to each of the second IDTs with respective propagation delays; and means terminating each of the second IDTs with a low impedance in the order of 10 ohms.

The low impedance termination, which is preferably of the order of 10 ohms or less, minimizes acoustic regeneration of SAWs by the second IDTs. This is in distinct contrast to the arrangement described in the Panasik et al. article discussed above, in which the FET tap weight control amplifiers present a relatively high impedance termination to the tapping IDTs.

Preferably the means terminating the second IDTs with a low impedance comprises a plurality of buffer amplifiers each having an input with a low input impedance coupled to a respective one of the second IDTs. Conveniently each buffer amplifier has an input impedance of the order of 10 ohms (for example 12.5 ohms in the embodiment of the invention described below) or less. Advantageously each buffer amplifier comprises an input transformer for impedance matching.

The second IDTs are preferably arranged adjacent one another on at least one side of the first IDT, the SAW device including grounded dummy fingers between adjacent ones of the second IDTs. The grounded dummy fingers between adjacent ones of the second IDTs can have a different width and spacing from fingers of the second IDTs to maintain a substantially constant metallization ratio in the second IDTs and therebetween. This maintains a substantially constant delay period between adjacent ones of the second IDTs, and minimizes reflections due to MEL (mass and electrical loading).

Desirably, the first IDT comprises an apodized IDT, whose apodization pattern can provide a desired filtering function, and each of the second IDTs comprises an unapodized IDT so that simplicity and substantial identity of the second IDTs is facilitated.

The invention also extends to a SAW device tapped delay line as recited above; further comprising means for coupling a signal to be equalized to the first IDT; means for weighting outputs of the buffer amplifiers in dependence upon respective equalizer coefficients to produce respective weighted signals; and means for summing the weighted signals so as to function as an equalizer to produce an equalized signal. Such an equalizer can in particular be an IF ATDE for a receiver in a microwave radio digital signal transmission system.

Preferably the means for weighting comprise multipliers each for multiplying an output of a buffer amplifier by a respective equalizer coefficient.

In such an equalizer preferably the SAW device tapped delay line comprises $2n+1$ second IDTs and $2n+1$ buffer amplifiers, and the multipliers comprise 2n multipliers for each of two phase quadrature signal components of the signal to be equalized. The means for summing the weighted signals conveniently comprises an amplifier, having an input with a low input impedance, and a plurality of resistors each coupling a respective weighted signal to the input of said amplifier.

The invention also provides a SAW device tapped delay line as recited above further comprising; means for weighting a signal to be equalized, in dependence upon respective equalizer coefficients, to produce respective weighted signals; a plurality of amplifiers each coupling a respective one of the weighted signals to a respective one of the second IDTs, each amplifier having a low output impedance constituting said means terminating each of the second IDTs with a low impedance; and means for deriving an equalized signal from the first IDT.

BRIEF DESCRIPTION OF THE DRAWINGS

The invention will be further understood from the following description with reference to the accompanying drawings, which are schematic and diagrammatic only in which similar references are used in the different figures to denote similar parts and in which.

DESCRIPTION OF THE PRIOR ART

Figure 1:
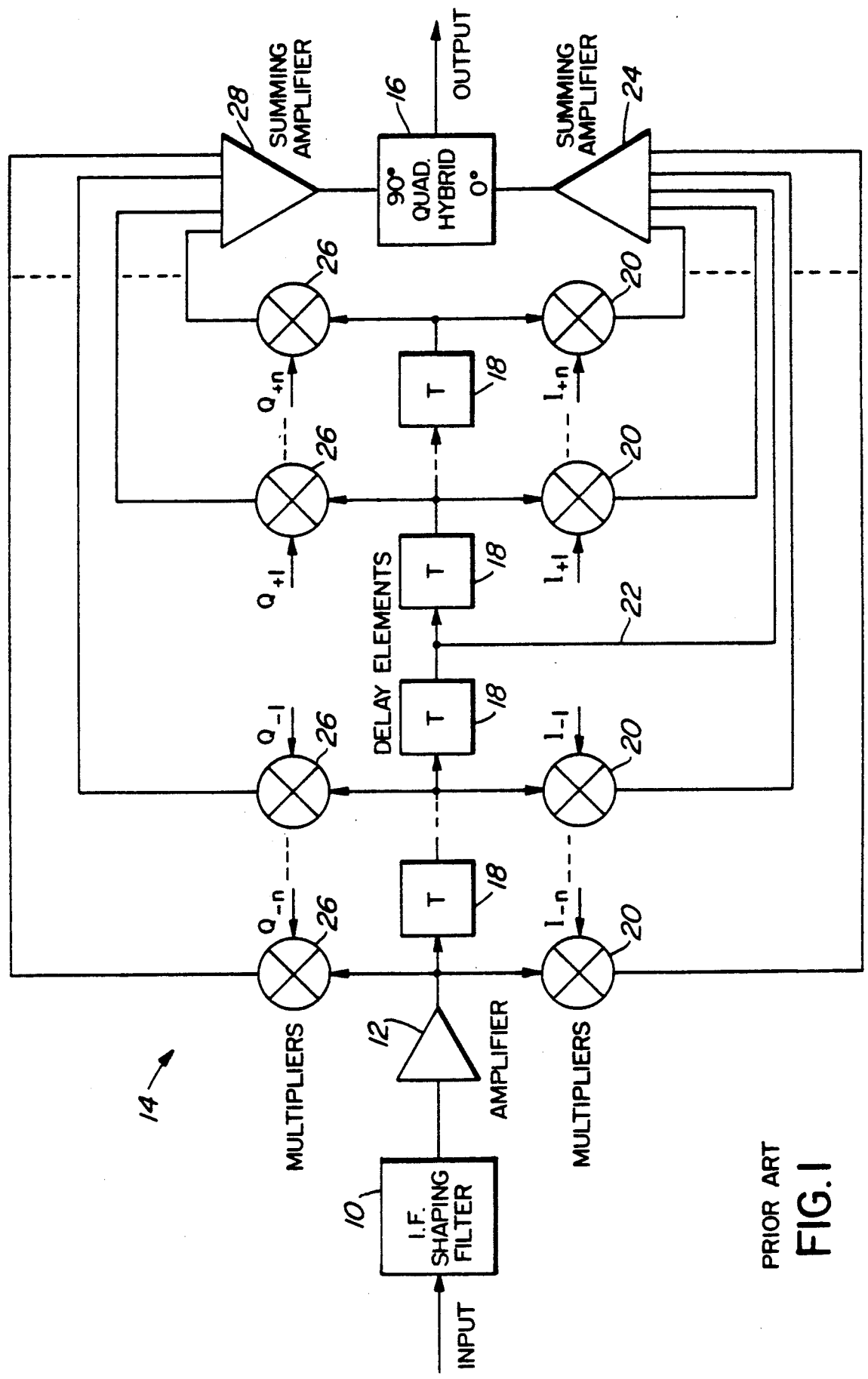
FIG. 1 illustrates a known form of IF ATDE for a microwave radio receiver.

Referring ti FIG. 1, there is illustrated a known form of ATDE for a QAM microwave radio receiver for equalizing I and Q components at an IF of the receiver. FIG. 1 also shows an IF shaping filter 10, which is part of the IF circuitry, via which an input IF signal is supplied to the ATDE. The ATDE consists of an input buffer amplifier 12, a transversal filter 14, and a quadrature hybrid or signal combiner 16 which produces an equalized IF output signal for subsequent demodulation. The transversal filter 14 comprises a tapped delay line having 2n similar lumped delay elements 18, each providing a delay of T which is the inverse of the symbol rate of the microwave radio transmission system, n being an integer; 2n multipliers 20 coupled to respective taps of the delay line for multiplying signal components from these taps by respective I component equalization coefficients $I_{-n}$ to $I_{+n}$; a summing amplifier 24 for summing the outputs of the multipliers 20 and a central tap signal component on a line 22 to produce an I component signal for the quadrature hybrid combiner 16; 2n multipliers 26 coupled similarly to the multipliers 20 for multiplying the signal components from these taps by respective Q component equalization coefficients $Q_{-n}$ to $Q_{+n}$; and a summing amplifier 28 for summing the outputs of the multipliers 26 to produce a Q component signal for the quadrature hybrid combiner 16. The equalizer coefficients are produced and automatically updated by control circuitry which is not shown.

As already discussed, such a known form of ATDE has the disadvantage of using bulky and expensive lumped elements for the delay line, which elements also require tuning by skilled persons. This disadvantage increases with the value of the integer n.

DESCRIPTION OF THE PREFERRED EMBODIMENT OF THE PRESENT INVENTION

Figure 2:
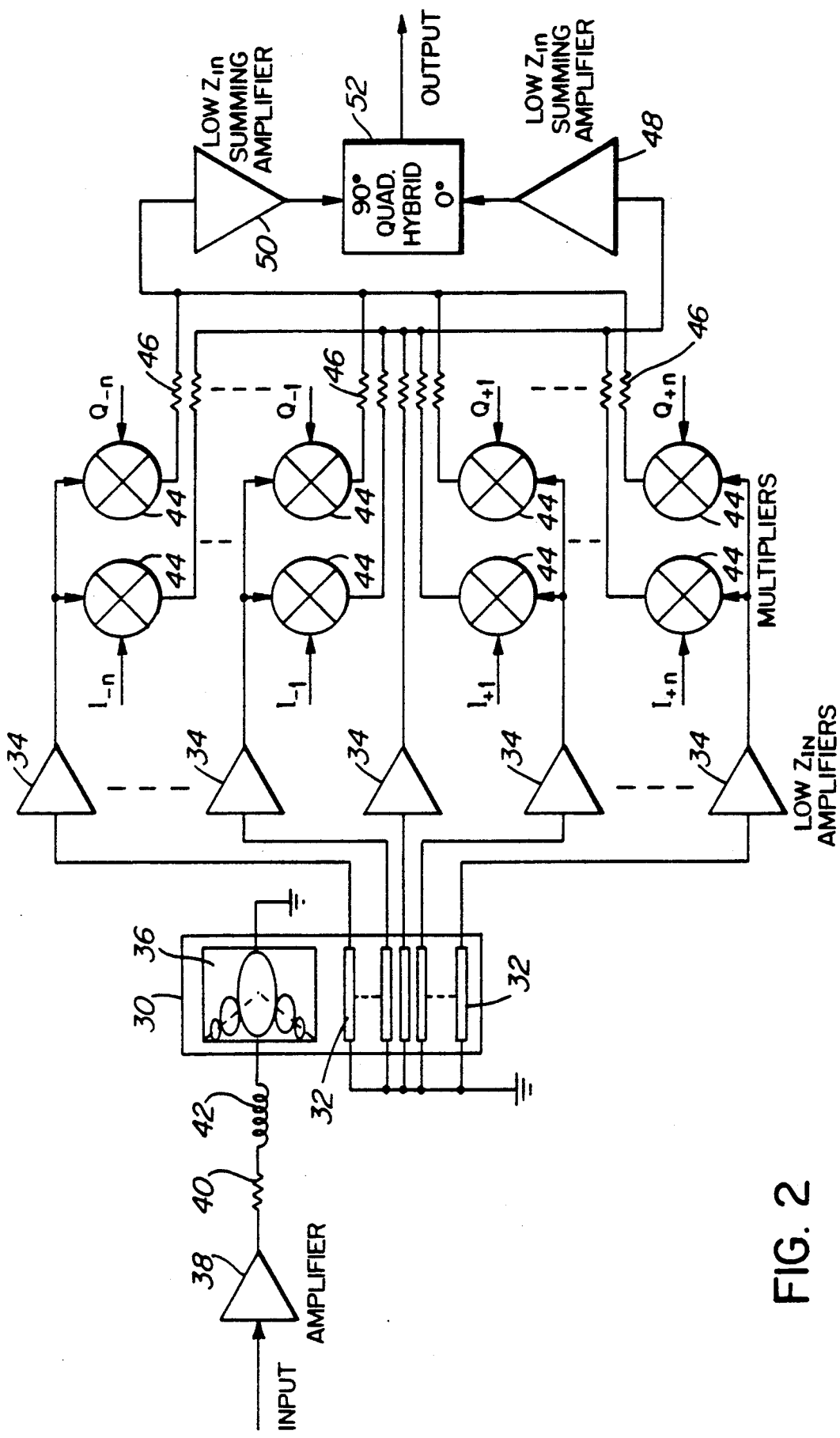
FIG. 2 illustrates an IF ATDE using a SAW device tapped delay line in accordance with an embodiment of this invention.

FIG. 2 illustrates an IF ATDE using a SAW device tapped delay line in accordance with an embodiment of this invention, in which this disadvantage of the prior art is substantially eliminated. In addition, it is observed here that the ATDE of FIG. 2 enables the discrete IF shaping filter 10 in the arrangement of FIG. 1 to be dispensed with, in that the filtering function of this filter can be embodied in the apodization pattern of the apodized IDT in the SAW device used in FIG. 2 as described below.

In the IF ATDE of FIG. 2, the tapped delay line is constituted by a SAW device 30 with $2n+1$ tapped output IDTs 32 coupled to respective ones of $2n+1$ low input impedance ($Z_{IN}$) buffer amplifiers 34 as described further below. An input IF signal is coupled to an apodized input IDT 36 of the SAW device 30 via a low output impedance buffer amplifier 38 and optional series tuning resistor 40 and inductor 42. Outputs of the buffer amplifiers 34, multiplied by respective I and Q component coefficients in multipliers 44 similarly to the multipliers 20 and 26 of FIG. 1, produce currents which are summed via resistors 46 and low input impedance summing amplifiers 48 and 50 for the I and Q signal components respectively, whose outputs are combined in a quadrature hybrid 52 to produce an equalized output IF signal.

Figure 3:
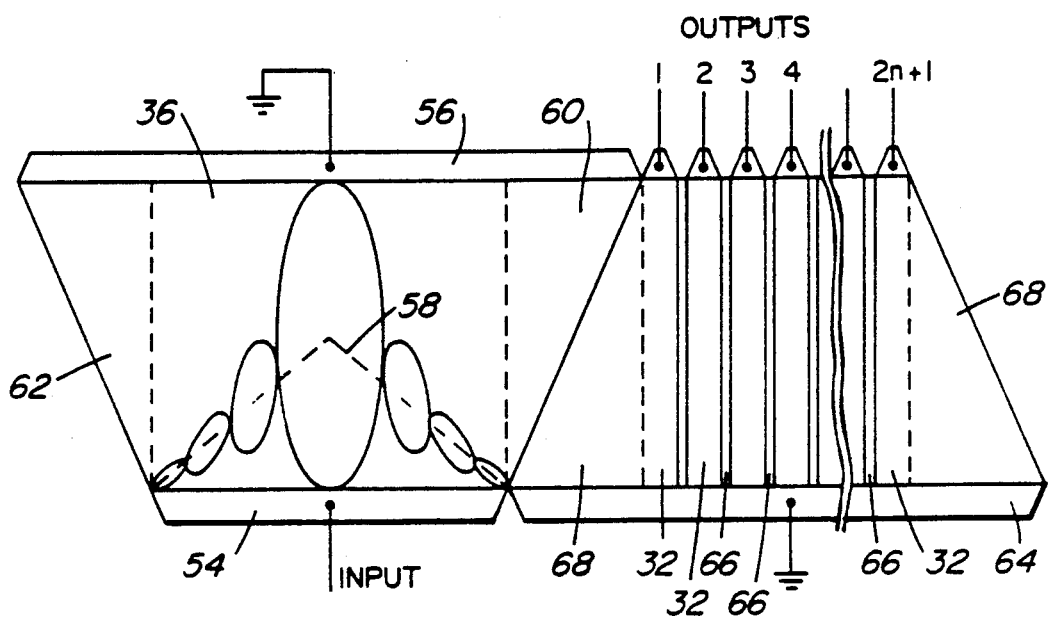
FIG. 3 illustrates IDTs of the SAW device of FIG. 2.

FIG. 3 illustrates in greater detail the form of the IDTs 32 and 36 which are fabricated on a substrate 76 (shown in FIG. 5) of the SAW device 30. The input IDT 36 is an apodized IDT with a driven conductive rail 54, a grounded conductive rail 56, an apodization pattern having an axis, shown by a broken line 58, which has the shape of a V extending from the ends of the driven rail 54, and grounded front and rear tapered reflection suppressing dummy finger regions 60 and 62 respectively, all of the form known from the Suthers et al. patent referred to above. As described in greater detail below with reference to FIG. 4, the $2n+1$ output IDTs 32 are unapodized IDTs which are all substantially identical to one another, with a common grounded conductive rail 64, which is distinct from the grounded rail 56 to provide isolation between the input and outputs of the SAW device, and with respective output connections numbered 1 to $2n+1$ in FIG. 3. The IDTs 32 are spaced from one another with a pitch which corresponds to the symbol rate; in other words the spacing of the IDTs 32 is such that a SAW propagated from the input IDT 36 reaches successive output IDTs 32 after successive delays T. Grounded dummy fingers are provided in regions 66 between adjacent output IDTs 32, and grounded tapered reflection suppressing regions 68 are provided adjacent the end output IDTs 32 numbered 1 and $2n+1$, the former region complementing the taper of the fingers 60 in the manner described in the Suthers et al. patent referred to above.

Figure 4:
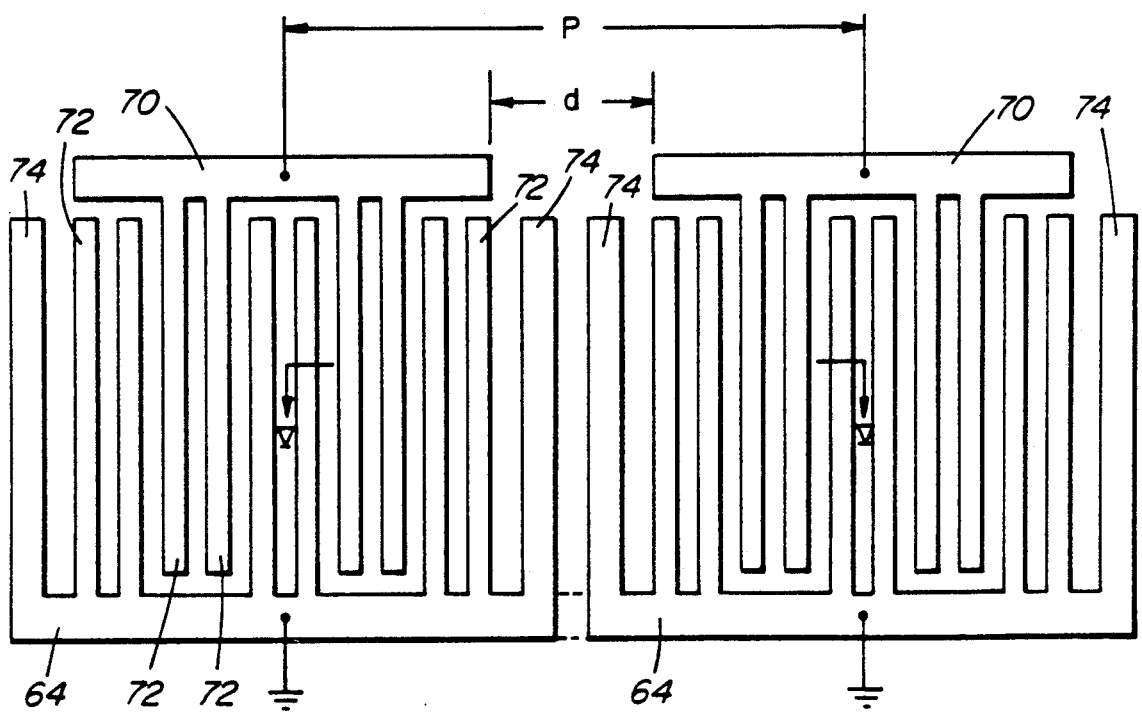
FIG. 4 illustrates an arrangement of two adjacent output IDTs of the SAW device of FIG. 2.

FIG. 4 illustrates in greater detail the arrangement of two adjacent output IDTs 32; the grounded conductive rails 64 thereof may be separate as shown by solid lines, in which case they may be externally interconnected, or they may be continuous as shown by broken lines in FIG. 4. The output rails are referenced 70 in FIG. 4.

In FIG. 4, each IDT 32 is shown as extending over a distance of 2.5 wavelengths λ of the SAW, with pairs of inter-digital fingers 72 extending alternately from the grounded and output rails. Each finger 72, and each gap between two adjacent fingers 72, has a width of $\lambda/8$, the IDTs thereby having a metallization ratio of 0.5. For the reasons already discussed above, the pitch or center-to-center spacing P of the IDTs 32, and hence the distance d between adjacent IDTs 32, is not generally an integral multiple of $\lambda/2$, so that the grounded dummy fingers 74 in the 66 between the IDTs must have a different width and/or the fingers 72 of the IDTs. The widths of these fingers 74 and gaps therebetween are selected also to provide a metallization ratio of substantially 0.5 to maintain a substantially constant SAW velocity, and hence a substantially constant delay T between successive output IDTs 32.

Figure 5:
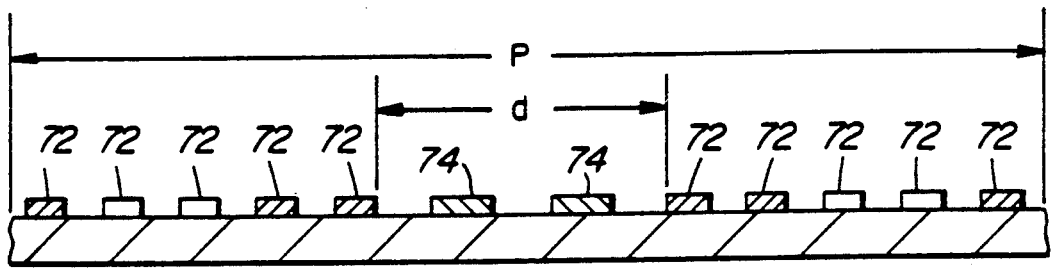
FIG. 5 is a cross-sectional illustration of IDT fingers, the section being taken on the line V—V of FIG. 4.

FIG. 5 illustrates a cross-section of the fingers 72 and 74, taken over one pitch period P on the line V—V of FIG. 4, on the substrate 76 of the SAW device 30, and shows more clearly the different widths of the fingers 72 and 74 and of the gaps therebetween. In FIG. 5, fingers 72 connected to the output of the respective IDT are shown unhatched, fingers 72 connected to the grounded rail 64 are shown hatched in the same direction as the substrate 76, and the grounded dummy fingers 74 are shown with opposite hatching.

Figure 6:
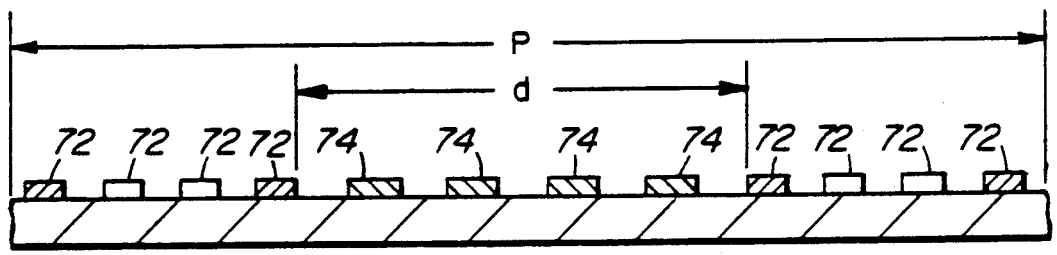
FIGS. 6 and 7 are cross-sectional illustrations, similar to FIG. 4, of alternative output IDT finger arrangements.
Figure 7:
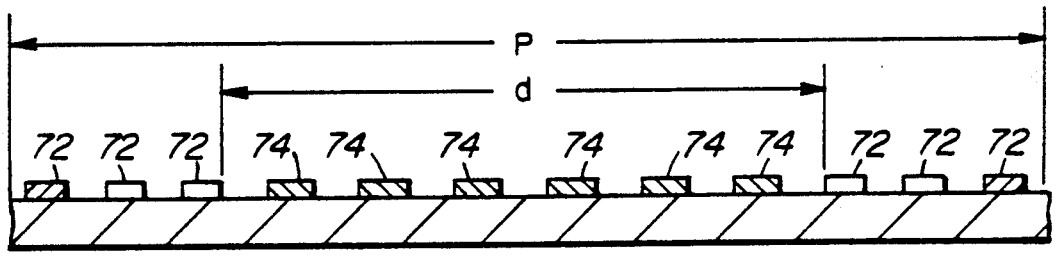

FIGS. 6 and 7 show, in the same manner as FIG. 5, alternative arrangements in which each IDT 32 extends for a lesser distance of respectively 2 and 1.5 wavelengths l, the number of grounded dummy fingers 74 and the distance d increasing accordingly. In each case, the pitch P and the metallization ratio of 0.5 are maintained constant.

The arrangements of the output IDTs 32 described above reduce to a low level the problem of reflections due to MEL discussed in the introduction. The problem of acoustic regeneration at the output IDTs 32 also discussed in the introduction is reduced by the termination of each of the output IDTs 32 with a low impedance, provided by the low input impedance of the buffer amplifiers 34 to which all the output IDTs 32 are coupled as shown in FIG. 2.

More particularly, each output IDT 32 is terminated with an impedance which is as low as possible, whilst avoiding an excessive insertion loss for the SAW device. The insertion loss of the SAW device increases with decreasing terminating impedance, because less energy is transferred at the outputs; however, the mismatch at the output IDTs reduces the level of acoustic regeneration. In practice, a compromise must be reached, for terminating each output IDT 32, between an impedance which is as small as possible, for example less than about 10 ohms, to provide minimal acoustic regeneration, and a higher impedance for reduced insertion loss. An impedance of about 12.5 ohms has been found to be acceptable for a SAW device with output IDTs 32 as illustrated in FIGS. 4 and 5.

Figure 8:
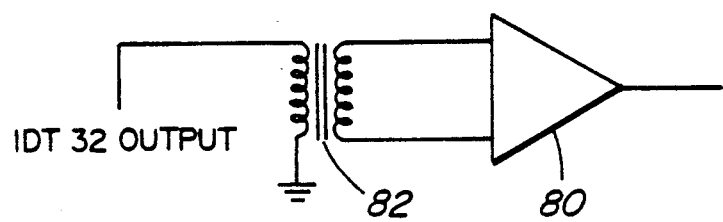
FIGS. 8 and 9 illustrate alternative forms of a low input impedance buffer amplifier of the IF ATDE of FIG. 2.

To this end, FIG. 8 illustrates a preferred form of each buffer amplifier 34. The buffer amplifier shown in FIG. 8 comprises an amplifier 80 having differential inputs with an input impedance of 50 ohms, coupled to the secondary of a transformer or balun 82 whose primary is connected between the output of the respective output IDT 32 and ground. The transformer 82 is a small ferrite-cored bifilar-wound transformer having only a few turns providing a 2:1 turns ratio, and hence a 4:1 impedance ratio, to present a terminating impedance of 12.5 ohms to the IDT 32. The amplifier 80 can have a common emitter transistor input stage, and has an output impedance of 75 ohms.

Figure 9:
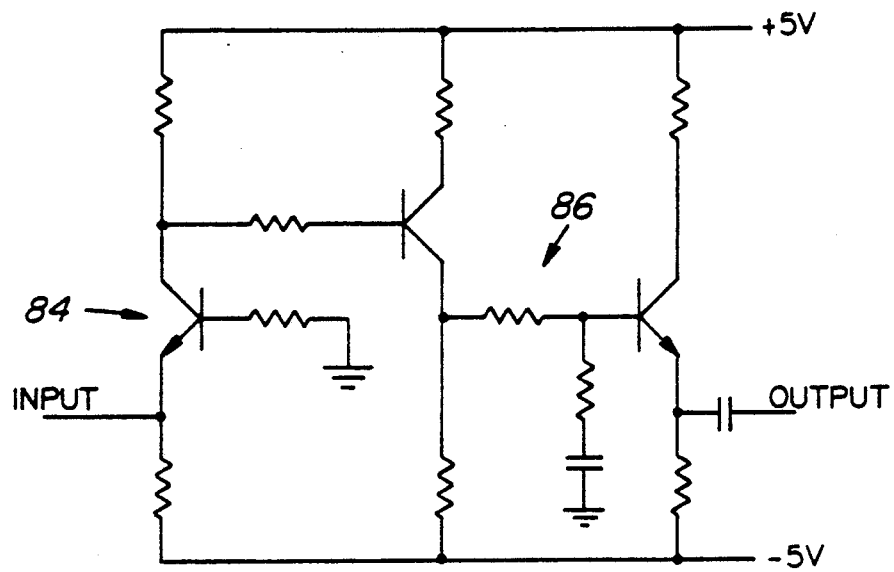

An alternative form of each buffer amplifier 34 is illustrated in FIG. 9; this has the advantage that the amplifiers 34 may potentially be integrated directly with the SAW device 30, but has the disadvantage of increased noise compared with the amplifier of FIG. 8. Referring to FIG. 9, the amplifier shown therein comprises a common base transistor input stage 84 providing the amplifier with the desired input impedance of 12.5 ohms, and a two-transistor Darlington output stage 86 providing an output impedance of 75 ohms.

The multipliers 44 in the ATDE of FIG. 2 each comprise a commercially available high speed double balanced mixer, integrated circuit type MC12002, providing 75 ohm input and output impedances.

Figure 10:
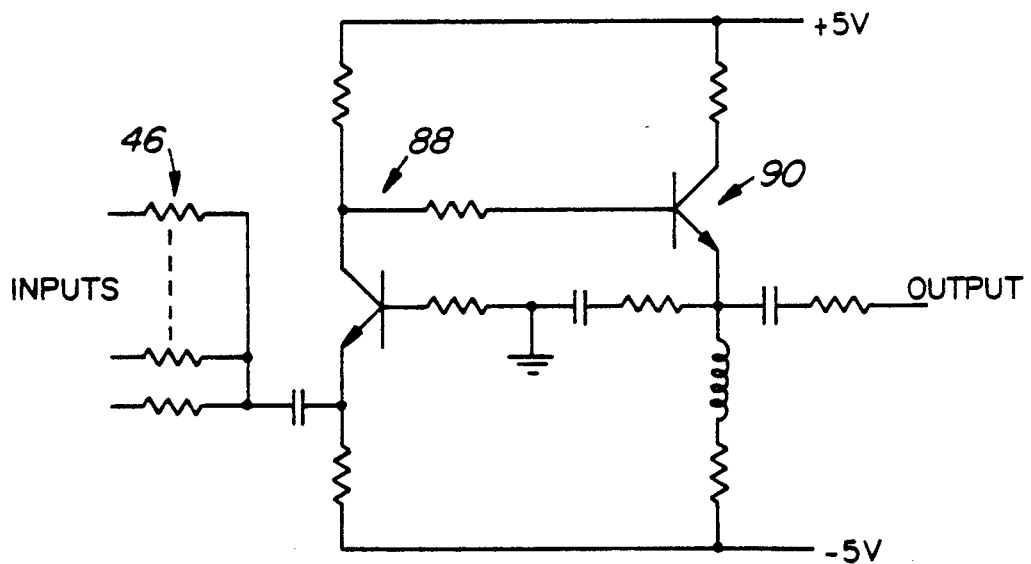
FIG. 10 illustrates a summing amplifier and associated resistors of the IF ATDE of FIG. 2.

As illustrated in FIG. 2, the outputs of the multipliers 44 and the central tap buffer amplifier 34 are summed via the summing resistors 46 in the summing amplifiers 48 and 50. FIG. 10 illustrates one of the summing amplifiers and its associated summing resistors 46, each of which has a resistance of 75 ohms to match the output impedance of the buffer amplifier 34 or multiplier 44 to which it is connected. The summing amplifier itself has a low input impedance, of the order of 3 ohms, to provide a large degree of isolation between the signals being summed.

To this end, the summing amplifier includes a common base transistor input stage 88, with a common collector transistor output stage 90 with an output impedance of 75 ohms for feeding the quadrature hybrid 52.

Although a particular embodiment of the invention, applied to a microwave radio receiver IF ATDE, has been described in detail above, it should be appreciated that the invention is also applicable in other ways and to other purposes in which the use of a SAW device tapped delay line is desired.

Figure 11:
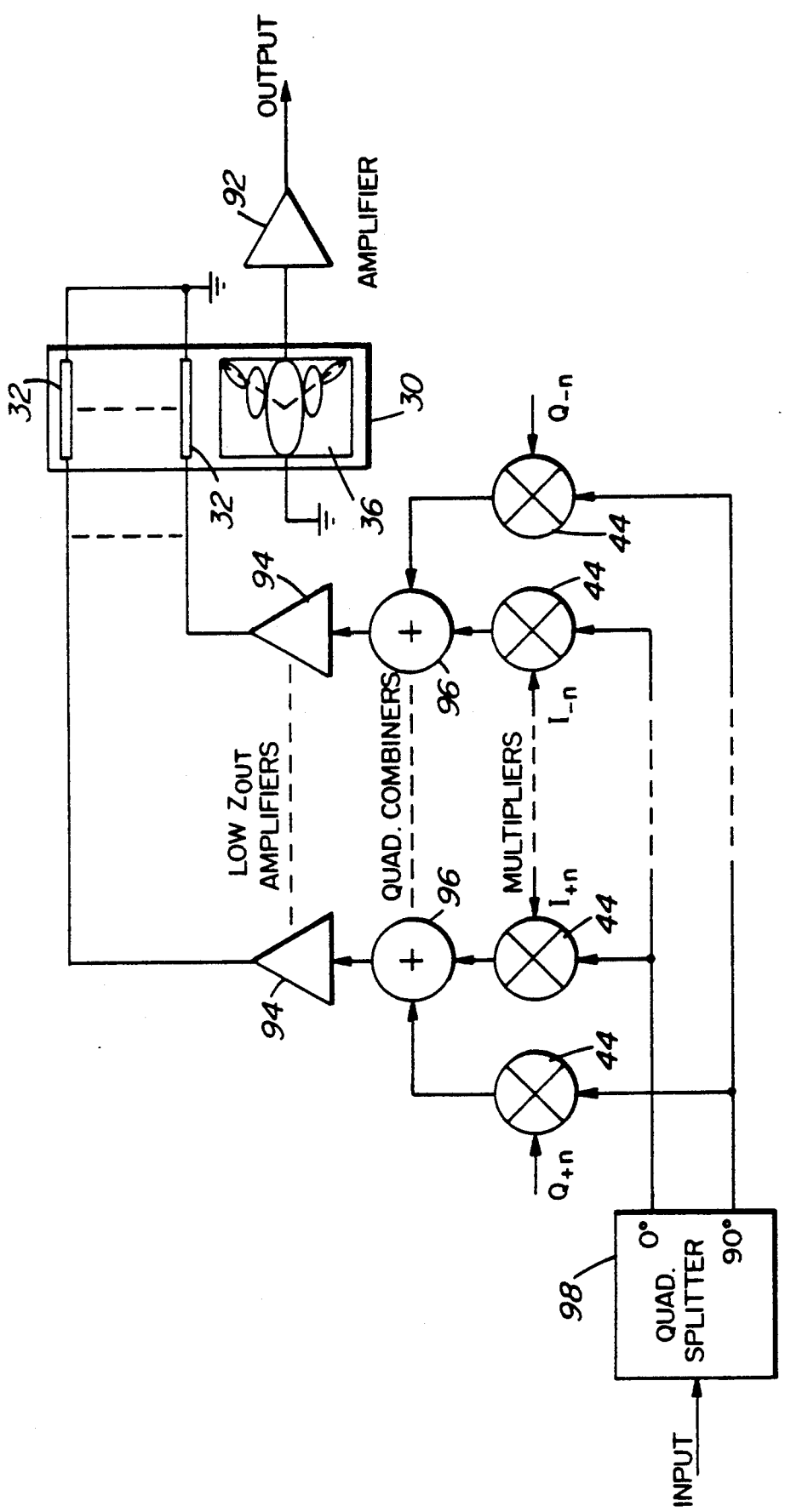
FIG. 11 illustrates another form of IF ATDE using a SAW device tapped delay line in accordance with this invention.

As one example of an alternative arrangement, FIG. 11 illustrates an inverted form of IF ATDE in which the SAW device 30 is used in the opposite direction; i.e. the sequential unapodized IDTs 32 are used as inputs and the apodized IDT 36 is used as an output, coupled to an output amplifier 92. In this arrangement the IDTs 32 are still terminated with low impedances for the reasons described above, these being constituted by the low output impedances $Z_{OUT}$ of amplifiers 94. The amplifiers 94 are supplied with input signals by quadrature combiners 96, which combine the outputs of pairs of multipliers 44 which multiply the I and Q component signals by the respective equalizer coefficients. The I and Q component signals are produced from an IF input signal by a quadrature splitter 98. This arrangement is less desirable than that of FIG. 2, as it requires that the 2n+1 IDTs 32 be driven, rather than only one IDT 36 as in FIG. 2, with consequently higher power consumption and dissipation.

In addition, it is observed that the SAW device 30 may take different forms from that described above. For example, in order to enable each output IDT to extend over a greater number of wavelengths λ, to increase the distance d between adjacent output IDTs, and/or to decrease insertion loss, the output IDTs may be distributed on both sides (front and rear) of the input IDT 36 instead of only one side as in FIG. 3, thereby utilizing the SAWs propagated in opposite directions from the input IDT 36. Thus on one side of the IDT 36 the odd-numbered output IDTs 1, 3, ... 2n+1 may be provided, with pitch corresponding to a delay of 2T between adjacent IDTs, and on the other side of the IDT 36 the even-numbered output IDTs 2, 4, ... 2n may be provided, also with a pitch corresponding to a delay of 2T between adjacent IDTs.

Numerous other modifications, variations, and adaptations may be made to the described embodiments of the invention without departing from the scope of the invention as defined in the claims.

What is claimed is:

1. An equalizer comprising:
   a SAW (surface acoustic wave) device tapped delay line including a SAW device having a first IDT (inter-digital transducer) for generating a SAW in response to an input signal applied thereto and a plurality of second IDTs substantially identical to each other, arranged adjacent one another so as to have a predetermined pitch therebetween, with one of the plurality of second IDTs adjacent the first IDT for sequential propagation of the SAW from the first IDT to each of the second IDTs with respective propagation delays;
   a plurality of buffer amplifiers, each buffer amplifier having an input with a low impedance coupled to a respective one of the second IDTs, the low impedance on the order of 10 ohms;
   means for coupling an input signal to the first IDT;
   means for weighting outputs of the buffer amplifiers to produce respective weighted signals in dependence upon a respective one of a set of equalizer coefficients; and
   means for summing the weighted signals to produce an output signal so as to function as an equalizer.

2. An equalizer as claimed in claim 1 wherein the means for summing the weighted signals comprises an amplifier, having an input with a low input impedance, and a plurality of resistors each coupling a respective weighted signal to the input of said amplifier.

3. An equalizer as claimed in claim 1 wherein the means for weighting comprise multipliers each for multiplying an output of a respective buffer amplifier by a respective equalizer coefficient.

4. An equalizer as claimed in claim 3 wherein the input signal has two phase quadrature components, wherein the SAW device tapped delay line comprises 2n+1 second IDTs and 2n+1 buffer amplifiers, wherein n is an integer and wherein the multipliers comprise 2n multipliers for each of the two phase quadrature signal components of the input signal to be equalized.

5. A SAW (surface acoustic wave) device tapped delay line comprising:
   a first IDT (inter-digital transducer) for generating a SAW in response to an input signal applied thereto;
   a plurality of second IDTs substantially identical to each other, arranged adjacent one another so as to have a predetermined pitch, with one of the second IDTs adjacent the first IDT for sequential propagation of the SAW from the first IDT to each of the second IDTs with respective propagation delays; and
   means terminating each of the second IDTs with a low impedance on the order of 10 ohms.

6. A SAW device tapped delay line as claimed in claim 5 wherein grounded dummy fingers are positioned adjacent ones of the second IDTs.

7. A SAW device tapped delay line as claimed in claim 6 wherein each of the second IDTs comprise a plurality of spaced fingers and wherein the grounded dummy fingers between adjacent ones of the second IDTs have a different width and spacing relative to a width and spacing of the fingers of the second IDTs to maintain a substantially constant metallization ratio, in the second IDTs for the plurality of spaced fingers, and therebetween for the grounded dummy fingers, the metallization ratio being the ratio of finger width to finger spacing.

8. A SAW device tapped delay line as claimed in claim 7 wherein the first IDT comprises an apodized IDT and each of the second IDTs comprises an unapodized IDT.

9. A SAW device tapped delay line as claimed in claim 5 wherein the first IDT comprises an apodized IDT.

10. An equalizer comprising:
    a SAW device tapped delay line including a SAW device having a first IDT (inter-digital transducer) and a plurality of second IDTs substantially identical to each other, arranged adjacent one another so as to have a predetermined pitch therebetween, with one of the plurality of second IDTs adjacent the first IDT for sequential propagation of a SAW from each of the second IDTs with respective propagation delays to the first IDT;

means for weighting an input signal, in dependence upon respective equalizer coefficients, to produce respective weighted signals;

a plurality of amplifiers, each amplifier coupling a respective one of the weighted signals to a respective one of the second IDTs, each amplifier having a low output impedance on the order of 10 ohms for terminating each of the second IDTs with a low impedance; and means for deriving an equalized signal from the first IDT.

* * * * *